May 11, 1965 K. M. TRAMPEL 3,183,371

NONSATURATING TRANSISTOR TRIGGER CIRCUITS

Filed May 10, 1962

INVENTOR
KURT M. TRAMPEL

BY John F. Ostendorf

ATTORNEY 3,183,371
Patented May 11, 1965

3,183,371
NONSATURATING TRANSISTOR TRIGGER CIRCUITS

Kurt M. Trampel, Poughkeepsie, N.Y., assignor to International Business Machines Corporation, New York, N.Y., a corporation of New York Filed May 10, 1962, Ser. No. 193,764
13 Claims. (Cl. 307—88.5)

This invention relates to transistor switching circuits and, in particular, to trigger circuits employing transistors operable in nonsaturating manner.

In order that the information supplied to information handling apparatus may be rapidly processed, the circuits employed in the apparatus are required to have high switching speeds. As is well known to those skilled in the art, when transistor circuits are employed as switches in the apparatus, the processing speed of the information is inherently limited if the transistors are operated in the saturated mode (i.e., during the On condition of the transistor the collector-base junction is permitted to become forward biased permitting minority carriers to accumulate in the base region). The resultant effect of saturated operation is a storage time delay before these carriers can be extracted from the transistor enabling it to be switched to an Off condition. As a result, numerous techniques have been devised for preventing circuit operation of transistors in the saturated mode thereby enhancing the operating speeds of the circuits.

Although the prior art is replete with examples of high speed transistor circuits having saturation control arrangements, these principles of saturation control have not been applied to enhance the operating speeds of circuits operable in more than one state. Consequently, the need exists for high speed trigger circuits employing transistors operating in nonsaturating manner.

Accordingly, it is a general object of the invention to provide trigger circuits operable in high speed manner.

It is another object of the invention to provide transistor switching circuits having provision for operation of the transistors in nonsaturating manner.

It is a further object of the invention to provide transistor trigger circuits requiring a minimum number of additional components to accomplish the control of saturation in the transistors.

A more specific object of the invention is to provide nonsaturating transistor trigger circuits operated in high speed manner by simultaneously controlling the base current of two transistors during one phase of operation and by controlling the collector current of one of these transistors during a second phase of operation.

In accordance with an aspect of the invention, there is provided a trigger circuit having two states of operation manifested as two different levels of an output signal. The trigger circuit comprises two transistors each having emitter, base and collector and biased so that one transistor is normally conducting to provide one of the two output levels. The other transistor is normally nonconducting and capable of responding to an input signal. Means are included in the circuit to couple these transistors and normally to control the base current of the first transistor to prevent its operation in a saturated mode. This means is also operative, in conjunction with the application of the input signal, to switch the state of the circuit by rendering the first transistor nonconducting so that it provides the second level output signal and to control the current to the second transistor during its conduction to prevent its operation in a saturated mode. Means are also provided to couple the output of the first transistor to the input of the second transistor to maintain the state of the circuit in the absence of the input signal and means are connected in circuit with the second transistor to switch the state of circuit operation back to the original state.

A feature of the invention is the provision of a trigger circuit employing two transistors which conduct in nonsaturating manner during different states of circuit operation in response to means for regulating the base current of one during its period of conduction and for regulating the collector current of the other during its period of conduction.

Another feature of the invention provides for a high speed trigger circuit to employ two common base transistor amplifiers whose base current is simultaneously controlled during one state of operation and by controlling the collector current of one of these transistors during the other state of operation.

A further feature of the invention includes means which enable the circuit to operate in either a monostable or a bistable manner in a nonsaturating mode.

The foregoing and other objects, features and advantages of the invention will be apparent from the following more particular description of the preferred embodiments of the invention, as illustrated in the accompanying drawings, wherein.

Figure 1:
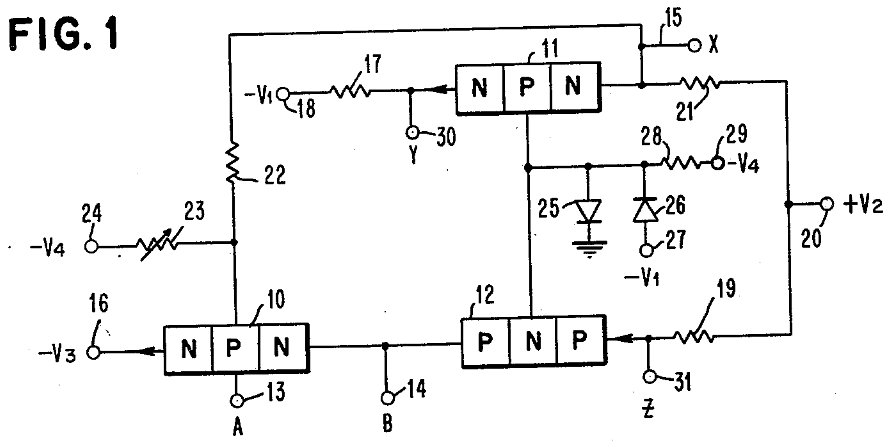
FIGURE 1 is a circuit diagram of a bistable trigger circuit according to the invention.

Referring now to FIGURE 1, the bistable trigger circuit embodying the principles of the invention comprises the NPN transistors 10 and 11 and the PNP transistor 12. The circuit is adapted to receive A and B input signals at the terminals 13, 14, respectively, and to provide an output signal X indicative of its state at the terminal 15.

Transistors 11 and 12 are connected as common base amplifiers, and transistor 10 operates as a variable impedance. As such, the emitters of the transistors 10, 11 are biased, respectively, from a negative voltage supply $-V_3$ coupled to a terminal 16 and through a resistor 17 from a negative voltage supply $-V_1$ coupled to a terminal 18 (the supply $-V_1$ being designed to be more positive than the supply $-V_3$). A common bias source (positive voltage supply $+V_2$ at terminal 20) is provided for the emitter of transistor 12 through a resistor 19 and for the collector of transistor 11 through a resistor 21. Output terminal 15 is also coupled to the collector of transistor 11 and a feedback path including a resistor 22 connects circuit output 15 with the base of transistor 10. This feedback path is shunted by a resistive device 23 connected to a negative voltage supply $-V_4$ at a terminal 24. Although the resistive device 23 may be a resistor, it is preferably a potentiometer which may be adjusted to compensate for variations in the beta characteristics of the transistor 10. If a simple resistor is employed at 23, it would be necessary to have tighter tolerance controls on the parameters of the transistor 10.

A resistor diode network, including a diode 25 which is referenced to ground potential, a diode 26 which is connected to the negative voltage supply $-V_1$ at a terminal 27, and a resistor 28 connected to the negative voltage supply $-V_4$ at the terminal 29, is connected to the bases of the transistors 11 and 12. The purpose and operation of this network will be more apparent from the description of the operation of the circuit which is provided hereinafter.

Transistors 10 and 12 are coupled together at their collectors to the input terminal 14 for receiving the B input signal and the transistor 10 is coupled at its base to the input terminal 13 for receiving the A input signal.

Figure 2:
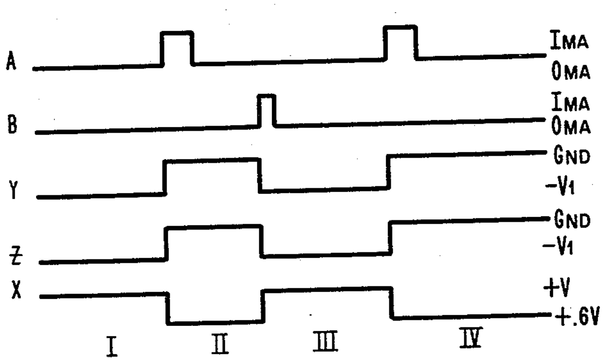
FIGURE 2 shows the operating waveforms of the circuit of FIGURE 1 during the various phases of operations; and, FIGURE 3 is a circuit diagram of a monostable trigger circuit according to the invention.

Transistors 11 and 12 are also connected to output terminals 30 and 31, respectively, for providing Y and Z power output signals. As shown in FIGURE 2, the levels of these signals are determined by the reference levels of the diodes 25 and 26.

In operation, if it is assumed that the transistor 10 is conducting, and, therefore, has a negligible impedance, it provides a current sink at 16 for the collector of transistor 12. The level of potential at the collector of transistor 12 approaches the $-V_3$ potential at terminal 16 and the emitter current of this transistor increases until the emitter and, thus, the potential at terminal 31 approaches the $-V_1$ potential applied to terminal 27. When the emitter of transistor 12 reaches $-V_1$ potential, the diode 26 conducts to clamp the emitter and base of transistor 12 to $-V_1$ thereby limiting the flow of current in this transistor to prevent saturation.

Since the bases of transistors 11 and 12 are connected in common to the resistor diode network and the diode 26 provides a negative voltage drop, the emitter-base junction of transistor 11 is reverse biased to render transistor 11 nonconductive. The level of the output signal at terminal 30 is therefore $-V_1$, and the level of the output signal at terminal 15 is at the higher of its two possible values approximating the value of the $+V_2$ supply at terminal 20. This aspect of operation corresponds to mode I as shown in FIGURE 2. Output signal X at terminal 15 is also coupled back to the base of transistor 10 and, as such, due to the design of the resistors 21 and 22, the potentiometer 23 and the power supplies at terminals 20 and 24, the base of transistor 10 is maintained at a positive level with respect to its emitter permitting this transistor to be biased in a conductive condition to satisfy the original assumption of conductivity in this transistor. The collector current of transistor 10 is limited by the emitter current of transistor 12 which, as already indicated, is controlled by the diode 26 and the resistor 28 to a level below the saturated operating level for the transistor 12. Thus, the transistor 10 is also operating in a nonsaturating condition corresponding to the On condition of the trigger circuit.

To switch the state of the trigger to mode II as shown in FIGURE 2, a current pulse is applied at terminal 13 and coupled to the base of transistor 10. This current pulse causes the potential level of the base of transistor 10 to become negative with respect to the $-V_3$ potential level of the emitter thereby rendering this transistor nonconductive. Since there is no collector current sink for the transistor 12 (transistor 10 is effectively an infinite impedance), the emitter current of this transistor decreases until the potential level at the emitter reaches the ground reference level of the diode 25. When this occurs, the diode 25 conducts and current flows from the $+V_2$ supply at terminal 20 through the resistor 19, the emitter and base of transistor 12, and the diode 25 to ground reference potential. Since the base of transistor 12 is referenced at ground potential, the base of transistor 11 is also referenced at this potential. The emitter of transistor 11 is at $-V_1$ potential and thus is more negative than the ground potential of the base. Transistor 11 conducts providing a ground potential output signal at terminal 30.

The potential level at the collector of transistor 11 is reduced to a level below the level of the positive voltage supply at the terminal 20 producing an output signal at terminal 15 which is approximately 0.6 of its initial value. Since the base swing of this transistor is controlled, this transistor is prevented from saturating. The level of the output signal at terminal 15 is coupled back to the base electrode of transistor 10 through the feedback path to hold transistor 10 in a nonconducting state permitting the current pulse at 13 to be removed. Thus, the trigger circuit is latched into a second stable state of operation designated the Off state.

As shown for mode II in FIGURE 2, the output signals at terminals 30 and 31 are at their higher levels and the output signal at terminal 15 is at its lower level. Until such time as an input pulse is applied to terminal 14, the circuit remains in this state without requiring the current input pulse at terminal 13.

To switch the trigger circuit back to its original state (the On state), a current pulse is applied at terminal 14 to provide a temporary collector current sink for the transistor 12. This permits emitter current to flow in the transistor 12 to the terminal 14. The emitter current of transistor 12 increases until the potential level at the emitter reaches $-V_1$ potential. When this occurs, the diode 26 conducts clamping the emitter and base of transistor 12 at $-V_1$ potential. Concurrently, the base of transistor 11 is rendered more negative than its emitter to reverse bias the emitter-base junction to render this transistor nonconductive. The level of the output signal at terminal 15 rises and is coupled back to the base of transistor 10 through the feedback path to render this transistor conductive. As this transistor conducts, it acts as a current sink for the emitter current of transistor 12 thereby permitting the current input pulse at terminal 14 to be removed. The circuit is latched into its On state as shown in mode III of FIGURE 2. It remains in this state until such time as a current pulse is applied to terminal 13 (mode IV).

In each of the stable states of operation, the conducting transistors are prevented from entering the saturated region of operation. This is accomplished in the On state of the circuit by controlling the collector current sink of a grounded base transistor. In the Off state of the trigger, it is accomplished by controlling the base swing of two grounded base transistors.

Although the transistors 10 and 11 have been shown and described as being of the NPN type and the transistor 12 of the PNP type, it is readily apparent that the conductivity types of these transistors may be replaced by their complements by simply changing the polarities of the biasing supplies. In such an instance, the levels of the output signals would be reversed in each state of operation from those described above.

Figure 3:
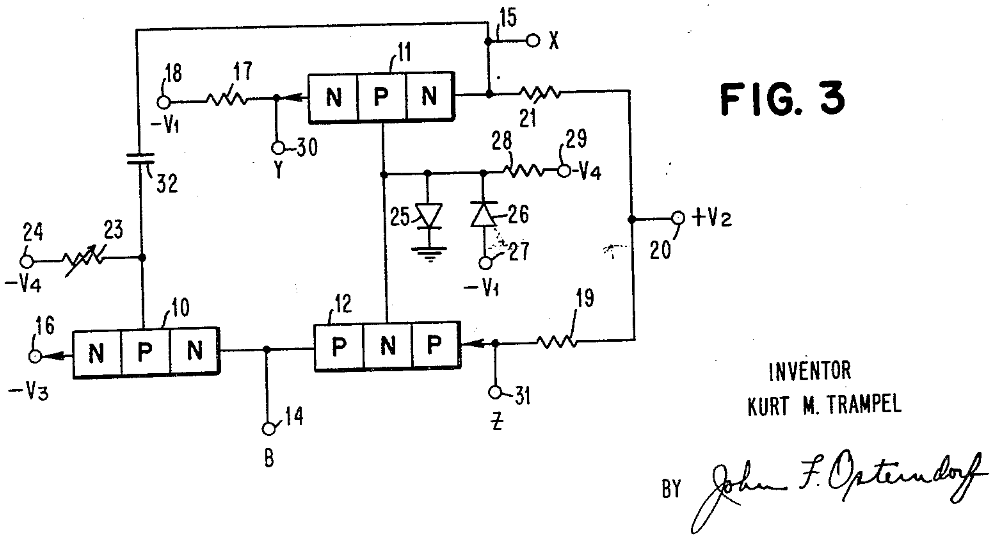

As previously mentioned, the principles of the invention are not limited to a bistable trigger circuit, but rather, are also applicable to monostable type circuits such as that shown in FIGURE 3. The circuit of FIGURE 3 is substantially the same as that of FIGURE 1 except that the resistor 22 is replaced by a capacitor 32. In addition, it is not necessary to supply the A current input pulse at the terminal 13. The duration of time that the circuit remains in the quasi-stable On state depends on the time constant of the RC circuit comprising the potentiometer 23 and the capacitor 32.

Considering the operation of this circuit, if it is assumed that the circuit in its stable Off state with the transistor 11 conducting and the transistor 10 nonconducting, the level of the output signal provided at terminal 15 is at the lower of the two levels. This signal is coupled to the base of transistor 10 through the feedback path to maintain the transistor 10 in a nonconducting condition to present an infinite impedance to the transistor 12. Transistor 12 operates as a diode with current flowing from its emitter to ground reference potential through the diode 25.

To switch the state of the circuit to the quasi-stable On state, a current pulse is supplied at terminal 14 to act as a temporary current sink for the emitter current of transistor 12. Emitter current flows in this transistor until the potential at the emitter reaches $-V_1$, at which the time the diode 26 conducts to clamp the emitter and base of transistor 12 at this potential. The base of transistor 11 is also clamped at this potential level reverse biasing the emitter-base junction of transistor 11 to render it nonconductive. The level of the otuput signal at terminal 15 rises and is coupled back to the transistor 10 to render this transistor conducting to latch the circuit into its On state. At this time, the current pulse at 14 can be removed. Concurrenly, the capacitor 32 is charged and, dependent on the time constant of the RC circuit, the trigger circuit remains in the quasi-stable state of operation until the capacitor discharges. When this occurs, the transistor 10 is rendered non-conducting. Since there is no current sink for the transistor 12, this transistor acts as a diode to supply current to ground reference potential. The base of transistor 10 is returned to ground potential causing it to conduct and the level of the output signal at terminal 15 returns to its lower level.

While this invention has been particularly shown and described with reference to a preferred embodiment thereof, it will be understood by those skilled in the art that the foregoing and other changes in form and details may be made therein without departing from the spirit and scope of the invention.

What is claimed is:

1. A trigger circuit having first and second states of operation, comprising:
   an input circuit for supplying an input signal to said circuit to switch the state of operation from said first state to said second state;
   a first transistor having emitter, base and collector and conducting in the first state of operation and nonconductive in the second state of operation;
   a second transistor having emitter, base and collector and coupled to said first transistor;
   said second transistor being responsive to the output of said first transistor to be in a conductivity condition opposite to the conductivity condition of said first transistor during said first and second states of operation;
   means coupled to the collector of said second transistor and to the base of said first transistor for regulating the base current of said first transistor during the first state of operation to prevent saturation of said first transistor and for acting as a limited source of current for said second transistor during the second state of operation to prevent saturation of said second transistor while simultaneously biasing said first transistor to nonconduction;
   said means being coupled to said input circuit to respond to the application of the input signal to render said first transistor nonconducting thereby rendering said second transistor conducting and switching the state of operation from said first state to said second state;
   and trigger means coupled to said second transistor for rendering said second transistor nonconducting permitting said circuit to revert from said second state to said first state by enabling said first named means to regulate the base current of said first transistor for conductivity thereof.

2. The circuit of claim 1, wherein the circuit is bistable and the trigger means comprises a second input circuit coupled to the base of said second transistor for providing an input signal to render said second transistor nonconducting.

3. The circuit of claim 1, wherein the circuit is monostable and the trigger means comprises a timing circuit coupling the output of said first transistor to the base of said second transistor so that said timing circuit responds to the output of said first transistor during the second state of operation to switch the conductivity condition of said second transistor after a predetermined period of time dependent on the time constant of said timing circuit.

4. The circuit of claim 1, and further comprising first and second means for providing first and second power output signals each residing at a first or second level determined by the state of operation of said circuit.

5. The circuit of claim 1, wherein the first named means includes a third transistor having emitter, base and collector and coupled at its collector to said input circuit and to the collector of said second transistor and at its base to a reference network and to the base of said first transistor.

6. A trigger circuit having first and second states of operation manifested as first and second level signals respectively at a circuit output comprising:
   an input circuit for supplying an input signal to said circuit to switch the state of operation from the first state to the second state;
   a transistor having emitter, base and collector and normally biased for conduction, said transistor being coupled to said circuit output to provide said first level signal when said transistor is conducting;
   a variable impedance device coupled to said circuit output and presenting a high impedance value sufficient to maintain the circuit in said first state when said transistor is conducting;
   means coupled to said device and to said transistor for regulating the base current of said transistor during its conduction to prevent saturable operation thereof;
   said means being coupled to said input circuit to respond to the application of the input signal to change the bias level of said transistor rendering the transistor nonconductive to change the state of the circuit to said second state by providing said second level signal at said circuit output;
   said device being responsive to the change of level at said circuit output to present a negligible impedance value to maintain the circuit in said second state;
   and trigger means in circuit with said device for switching said circuit from said second state to said first state.

7. The circuit of claim 6, wherein the circuit has two stable states of operation and the trigger means comprises a second input circuit for providing an input signal to vary the impedance of said device from the negligible value to the high value.

8. The circuit of claim 6, wherein the trigger means comprises a timing circuit coupling the output of said transistor to said device and responsive to the second level signal at said circuit output to vary the impedance of said device from said negligible value to said high value after a predetermined time duration dependent on the time constant of the timing circuit so that said circuit operates with one stable state and one quasi-stable state.

9. The circuit of claim 6 and further comprising first and second means for providing first and second power output signals each residing at a first or second level determined by the state of operation of said circuit.

10. In a trigger circuit having first and second states of operation manifested as first or second levels of an output signal provided by a first transistor during its conduction in the first state of operation and nonconduction in a second state of operation respectively, and connected in circuit with a second transistor having opposite conductivity conditions in the states of operation from the first transistor and means in circuit with the second transistor to render it nonconductive so that the circuit is in the first state of operation, the first and second transistors being in circuit with a third transistor for regulating the current supplied to the first and second transistors during their respective periods of conduction;
   circuit means including an input circuit coupled to the collectors of the second and third transistors for supplying an input signal to permit the input circuit to act as a temporary current sink for the current supplied by said third transistor so that the first transistor is biased to a nonconductive condition changing the level of the output signal to the second level which causes the second transistor to conduct to act as the current sink for the third transistor during the second state of operation.

11. A bistable trigger circuit comprising:
   first and second transistors, said first transistor being nonconducting in a first state of operation and conducting in a second state of operation and said second transistor having opposite conductivity conditions from said first transistor;

feedback means coupling the output of said second transistor to said first transistor to render said first transistor responsive to the conductivity condition of said second transistor;

means including a third transistor coupled to said first and second transistors for regulating the flow of current to said first transistor during its conduction to prevent saturation thereof while simultaneously biasing said second transistor to nonconduction and for regulating the current supplied to said second transistor during its period of conduction to prevent saturation thereof, said means being responsive to the application of an input signal to said circuit to bias said second transistor to nonconduction whereby said first transistor is rendered conducting and said circuit operates in the second state of operation;

and input means for supplying an input signal directly to said first transistor to trigger the state of circuit operation from the second state to the first state.

12. A monostable trigger circuit comprising:

first and second transistors, said first transistor being nonconducting in a first state of operation and conducting in a second state of operation and said second transistor having opposite conductivity conditions from said first transistor;

feedback means coupling the output of said second transistor to said first transistor to render said first transistor responsive to the conductivity condition of said second transistor;

means including a third transistor coupled to said first and second transistors for regulating the flow of current to said first transistor during its conduction to prevent saturation thereof while simultaneously biasing said second transistor to nonconduction and for regulating the current supplied to said second transistor during its period of conduction to prevent saturation thereof;

said means being responsive to the application of an input signal to said circuit to bias said second transistor to nonconduction whereby said first transistor is rendered conducting and said circuit operates in the second state of operation;

and timing means connected in said feedback means and responsive to the conductivity condition of said transistor during the second state of operation to trigger the first transistor to nonconduction after a predetermined period of time dependent on the time constant of said timing means.

13. A trigger circuit responsive to the application of an input signal to switch operation of the circuit from a first state of operation to a second state of operation, comprising first and second transistors coupled to each other with the second transistor responsive to the output of the first transistor and in a conductivity condition opposite to the conductivity condition of the first transistor during the states of operation.

said first transistor being in a conductive condition during the first state of operation and said second transistor being in a conductive condition during the second state of operation, means coupled to the first and second transistors for preventing saturation of the transistors during their respective conductive conditions and responsive to the application of the input signal to render the first transistor operable in a nonconductive condition and the second transistor operable in a conductive condition, and trigger means coupled to the second transistor for causing it to switch from the nonconductive condition to the conductive condition.

References Cited by the Examiner

UNITED STATES PATENTS

| | | | |
|---|---|---|---|
| 2,903,604 | 9/59 | Henle | 307—88.5 |
| 2,935,698 | 5/60 | Adams | 331—113 |
| 2,984,754 | 5/61 | Wolfe | 307—88.5 |

JOHN W. HUCKERT, *Primary Examiner.*

ARTHUR GAUSS, *Examiner.*